Oct. 6, 1970 H. E. HENSCHEN 3,533,045

SUPPORTING AND KEYING MEANS FOR PRINTED CIRCUIT BOARDS OR THE LIKE

Filed May 29, 1968 3 Sheets-Sheet 1

Oct. 6, 1970 H. E. HENSCHEN 3,533,045

SUPPORTING AND KEYING MEANS FOR PRINTED CIRCUIT BOARDS OR THE LIKE

Filed May 29, 1968 3 Sheets-Sheet 2

3,533,045
SUPPORTING AND KEYING MEANS FOR PRINTED CIRCUIT BOARDS OR THE LIKE

Homer Ernst Henschen, Carlisle, Pa., assignor to AMP Incorporated, Harrisburg, Pa.

Filed May 29, 1968, Ser. No. 732,936
Int. Cl. H01k *1/00*
U.S. Cl. 339—17 6 Claims

ABSTRACT OF THE DISCLOSURE

Supporting member for supporting a printed circuit board on a panel comprises a U-shaped or H-shaped extrusion, the free ends of the sidewalls of the extrusion having laterally and outwardly extending flanges which are notched adjacent to one end of the member. When the sidewalls are flexed towards each other, the ends of the flanges lie within the normal cross-sectional outline of the member so that the notched end can be inserted through a panel opening which has the same shape as the normal cross-sectional outline. When the sidewalls return to their normal positions, edge portions of the panel will extend into the notches to support the member on the panel. Keying of a printed circuit board on the panel is achieved by mounting a support at a unique position between aligned connectors and providing notch means in the printed circuit such that it can be mounted on the panel in straddling relationship to the uniquely mounted support.

BACKGROUND OF THE INVENTION

This invention relates to printed circuit board supports or card guides, as they are commonly called, and to improved keying means for printed circuit boards mounted on a panel, the improved keying means being effected by means of the board supports. The following pending applications are related to the instant application in that they show multi-contact electrical connectors and electrical contacts which are shown in the instant application: Ser. No. 716,491, filed Mar. 27, 1968, for Terminals and Manufacturing Method, by Thomas D. Desso and Homer E. Henschen; Ser. No. 701,365, filed Jan. 29, 1968, for Electrical Connectors for Printed Circuit Boards, by Robert H. Frantz and Homer E. Henschen.

Electrical circuit elements mounted on printed circuit boards are commonly interconnected by means of panels or mother boards having multi-contact electrical connectors mounted thereon. The printed circuit boards are inserted into the connectors so that the conducting paths on the printed circuit boards will engage the contacts in the connectors. These contacts, in turn, are electrically connected, by soldering, to conducting paths on the underside of the mother board or panel to effect interconnections between individual boards. As an alternative, the individual boards are sometimes mounted in side-by-side relationships in a channel-like chassis and the contact terminals extending from the contacts in the connectors are provided with terminal posts so that interconnections between boards can be made by point-to-point wiring techniques, that is, wrap-type electrical connections or clip-type electrical connections.

It is frequently desirable or necessary to provide supports on the mother board or on the opposite sides of the channel-like chassis for supporting the edges of the boards. In the past, it has been common practice to secure these supports to the mother board by staking or by the use of suitable fasteners. It is also frequently required that the individual printed circuit boards be keyed and/or polarized in a manner such that they can be inserted only into the connectors for which they are intended and can be inserted only when they are in a preferred orientation. Keying and/or polarizing has often been achieved in the past by mounting pins on the mother board or chassis and receptacles on the printed circuit boards and locating the pins and receptacles in a manner such that the individual boards can be mated only with the connector they are intended to be mated with.

It is an object of the present invention to provide an improved support for printed circuit boards. A further object is to provide improved mounting means for mounting a printed circuit board support on a panel-like member such as a mother board. A still further object is to provide a printed circuit capable of supporting a printed circuit board between two opposite edges thereof. A still further object is to provide a printed circuit board support which is capable of functioning as a keying and/or polarizing means for a printed circuit board. A still further object is to provide a support which can be manufactured by relatively simple molding or extruding processes.

These and other objects of the invention are achieved in one preferred embodiment thereof comprising an H-shaped printed circuit board support having laterally extending flanges on each of its sidewalls which project laterally inwardly towards each other and outwardly. These flanges are notched adjacent to the lower end of the support and bevelled so that the sidewalls can be flexed relatively towards each other to permit the guide to pass partially through a generally rectangular opening in a panel-like member. When the sidewalls return to their normal positions, the edge portions of the panel adjacent to the opening center the notches and lock the support to the panel.

The flanges on the sidewalls of the support are spaced-apart by a distance slightly less than the thickness of the printed circuit board with which the support is intended to be used so that the edge portions of an inserted board will be firmly gripped. Supports of this type can be mounted on the panel in the conventional manner, that is, at the opposite ends of a connector mounted on the board, so that the supports will receive the edge portions of the printed circuit board when it is inserted into the connector. Alternatively, a support in accordance with the invention can be mounted in a central portion of a panel and the edge of the printed circuit board can be notched in a manner such that the web portion of the H-shaped support enters the notch as the printed circuit board is inserted. Under these circumstances, the portions of the printed circuit board immediately adjacent to the notch are gripped between the laterally extending flanges on the sidewalls of the support. The support and the notch in the printed circuit board can be uniquely located, relative to other printed circuit boards and supports mounted on the panel, such that a particular printed circuit board can be uniquely keyed to a particular connector or to a pair of aligned connectors on each side of the support. The support can also function as a polarizing means for the board if the notch is located off center with respect to the edges of the board.

Figure 1:
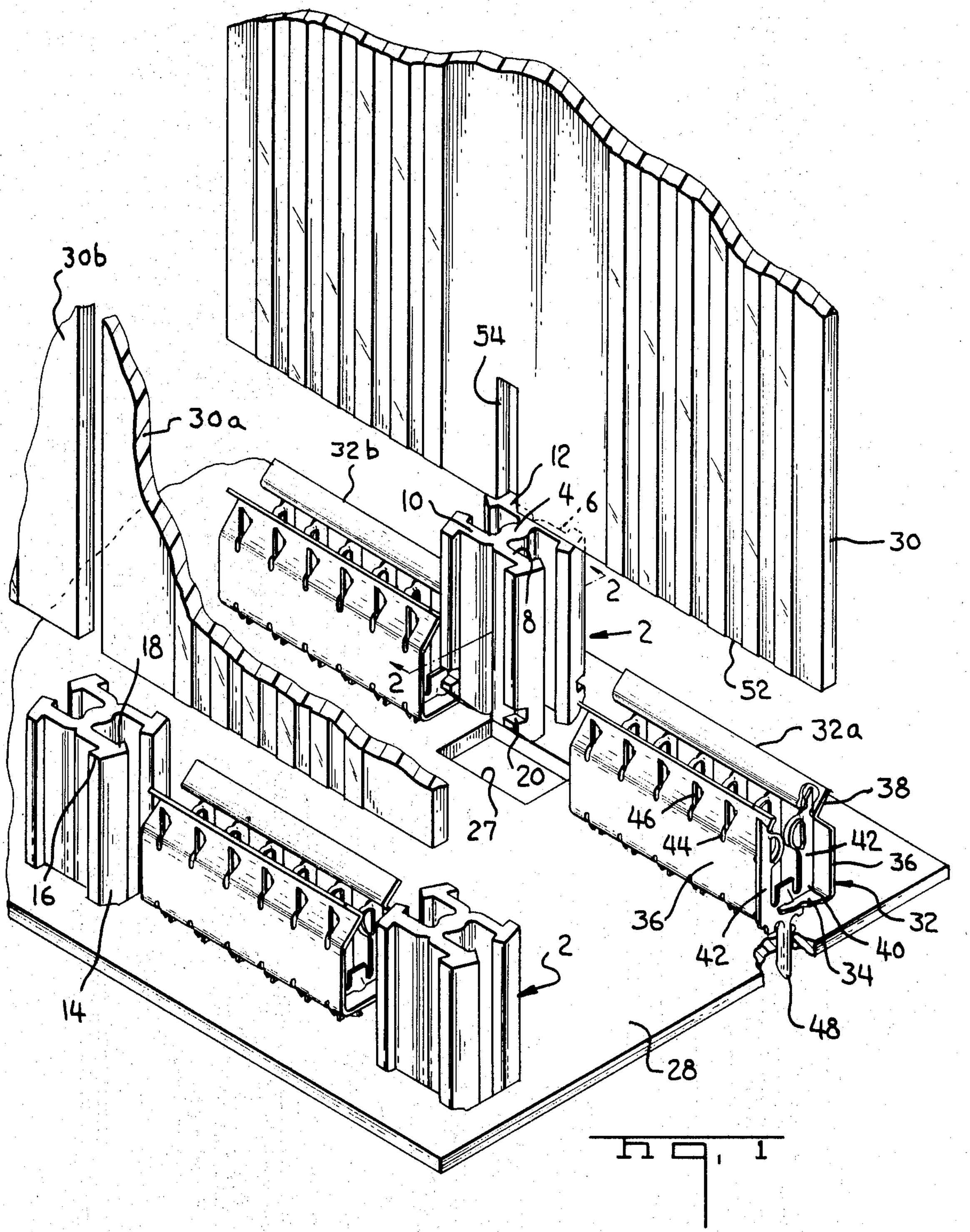
FIG. 1 is perspective view of a panel member or mother board having printed circuit board supports in accordance with the invention mounted thereon.
Figures 2, 3, 4, 5, 6, 7:
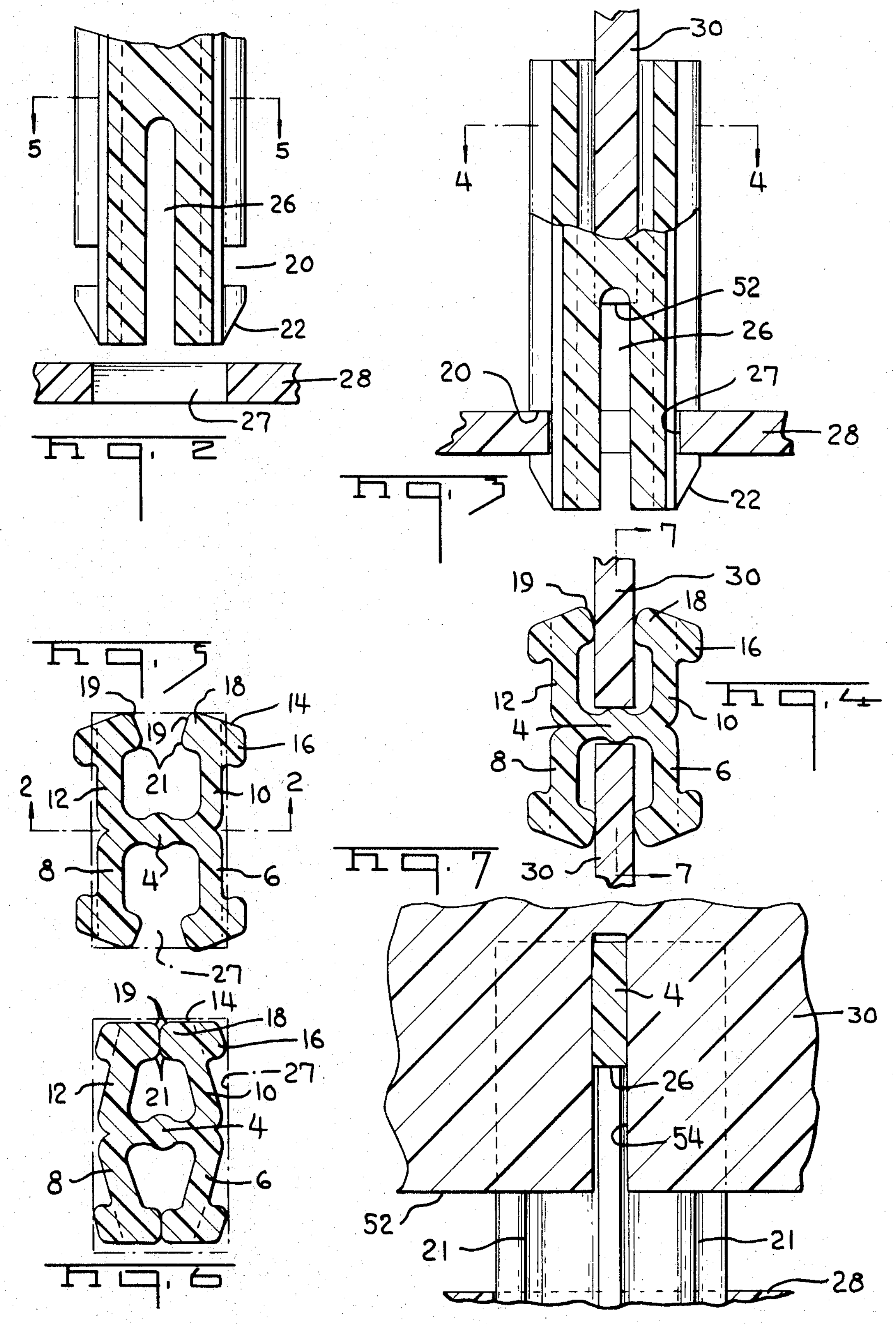
FIG. 2 is a sectional view taken along the lines 2—2 of FIG. 1 of a printed circuit board support in accordance with the invention.
FIG. 3 is a view similar to FIG. 2 but showing the manner in which the printed circuit board support is mounted on a mother board.
FIG. 4 is a view taken along the lines 4—4 of FIG. 3.
FIG. 5 is a view taken along the lines 5—5 of FIG. 2 and illustrating the alignment of a printed circuit board support with an opening in a mother board.
Figure 8:
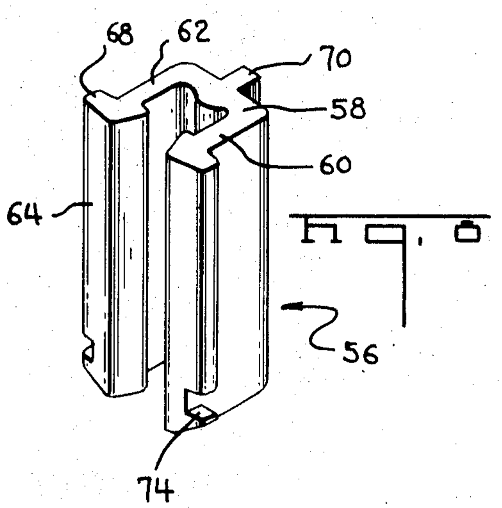
Figure 10:
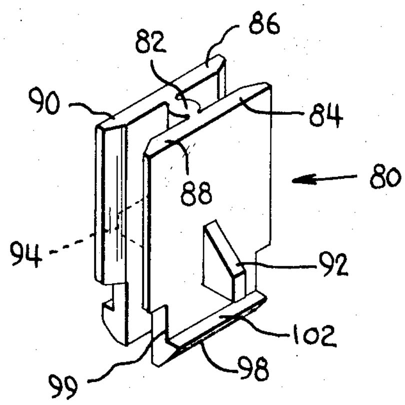
Figure 9:
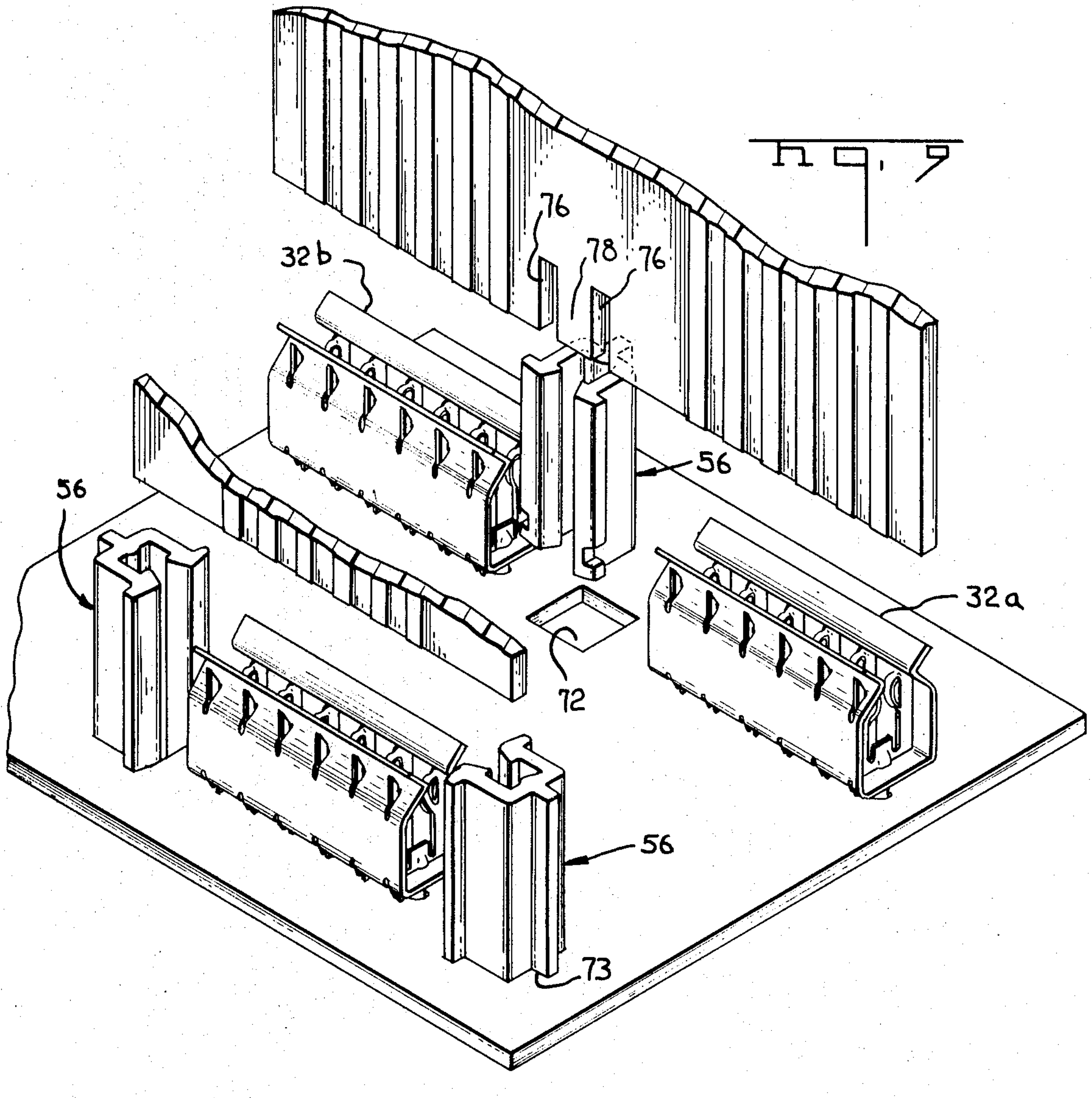

FIG. 6 is a view similar to FIG. 5 but showing the manner in which the lower portion of the support is deformed during insertion through the opening in the mother board;

FIG. 7 is a view taken along the lines 7—7 of FIG. 4;

FIG. 8 is a perspective view of an alternative form of printed circuit board support in accordance with the invention;

FIG. 9 is a view similar to FIG. 1 but showing printed circuit board supports of the type shown in FIG. 8 mounted on the mother board; and FIG. 10 is a perspective view of a further embodiment of the invention.

Referring first to FIGS. 1–7, one form of printed circuit board support 2 in accordance with the invention has a generally H-shaped cross-section comprising a web 4 and sidewalls 6, 8, 10, 12. Each of the sidewalls has a crown portion 14 which defines flanges extending laterally outwardly at 16 and inwardly at 18. It will be noted that the crown portions 14 of the sidewalls are slightly cocked, relative to the plane of the sidewalls, so that the outwardly extending flanges 16 slope towards the plane defined by web 4 while the inwardly extending flanges 18 slope in the opposite direction. It will also be noted that the opposed sides 19 of the flanges 18 are inclined inwardly towards each other and are mirror images of each other. This configuration of the crown portion of the sidewalls is purposely provided in order to permit mounting of the guide in a panel opening of minimum dimensions as will be explained below. The spacing between the inner edges 21 of the opposed sides 19 of the flanges 18 is preferably slightly less than the thickness of the printed circuit board 52 with which the card guide is to be used so that when the board is inserted into connectors having supports in alignment therewith, the flanges 18 will grip edge portions of the board.

The outwardly extending flanges 16 are notched as shown at 20 adjacent to the lower end of the support as viewed in FIG. 2 and the flanges themselves are bevelled as shown at 22 to provide a guiding surface when the support is mounted in the panel-like mother board 28. In the disclosed embodiment, the lower end portion of the web 4 is cut away as shown at 27 to facilitate inward flexure of these sidewalls at their lower ends during insertion. Under some circumstances, depending upon the thickness and flexibility of the plastic of the sidewalls, it is not necessary to remove a portion of the web.

The support is mounted in the panel 28 as illustrated in FIG. 2–7. The panel is provided with a rectangular opening 27 having a length and a width substantially equal to the distance between the remote ends of the crown portions 14 and the distance between the external surfaces of two opposed sidewalls respectively, as illustrated in FIG. 5. The lower portions of the sidewalls are flexed inwardly until the edges 21 of the sidewalls 6, 8 and 10, 12 are substantially against each other as shown in FIG. 6. Upon such flexure of the sidewalls, the surfaces of the crown portions 14 of the sidewalls will lie within an area equal to the area of the panel opening 27 by virtue of the inclination of these crown portions and the support can be simply inserted into panel opening. When the sidewalls, 6, 8, 10, 12 return to their normal positions, these crown portions will extend beyond the sides of the openings 27 and the edge portions of the board will extend relatively into the notches 20 to lock the support to the panel.

FIG. 1 shows a type of multi-contact electrical connector at 32 having fork-type contact terminals 40 mounted therein in parallel side-by-side relationship. Connectors and contact terminals of the general type shown are more fully described in co-pending applications referred to above, and need not be described in detail here. The connector 32 comprises a web 34 and sidwalls 36 which are inwardly then outwardly directed at their upper ends as shown at 38. The fork-type contacts 40 have a pair of parallel arms 42 which are interengaged with the sidewalls of the connectors as shown at 44, 46. The individual contact terminals have post portions 48 which extend through openings in the panel member 28 and, in the disclosed embodiment, are electrically connected to conductors on the underside of the panel by soldering. It will be realized that card guides and keying systems in accordance with the invention can be used with alternative forms of connectors, if desired.

In accordance with one aspect of the invention, shown in FIG. 1, a support 2 is mounted between, and in alignment with, two aligned connectors **32*a*, 32*b*. The printed circuit board 30 which is adapted to be inserted into the connectors 32*a*, 32*b* is provided with a notch 54 extending upwardly from its lower edge 52, the location of this notch being such that when the printed circuit board is moved downwardly from the position shown in the drawing, the web portion 4 of the guide 2 will enter the notch 54 and the portions of the board immediately adjacent to notch 54 will be gripped and supported between the inwardly directed flanges 18 of all of the legs 8–12 as shown in FIG. 4. In this mode of using the invention, the printed circuit board 30 receives substantial support from a single support 32 because of the fact that the board is gripped on each side of the notch 54**.

A further advantage of supporting the printed circuit board by means of a notch 54 located between its opposite edges is that the notch 54 and the panel opening 26 can be uniquely located on the panel, relative to other printed circuit boards and other panel openings, such that the board 30 is keyed to the connectors **32*a*, 32*b*. Thus, several boards which are otherwise identical can be provided with notches similar to the notch 54** at slightly different locations and the supports can be located to guide each board into the connectors with which it is intended to be mated. With such an arrangement, the supports perform multiple functions in that they each support a printed circuit board, key the board to a particular position on the panel, and guide it into predetermined multi-contact connectors.

Supports of the type shown in FIGS. 1–7 can also be mounted adjacent to the ends of a single connector and function to support the edge portions of the inserted board in the conventional manner as illustrated by the boards **30*a*, 30*b*. A single support 2 can function to support the adjacent edges of two printed circuit boards as illustrated by the boards 30*a*, 30*b*** in FIG. 1. As a further alternative, a single printed circuit board can be keyed to two or more aligned connectors by means of a central support and can be supported along its edges by additional supports.

Supports of the type shown in FIG. 1 are amenable to assembly to the mother board by a single inserting operation. In other words, the exploded support shown in FIG. 1 can be assembled until its bevelled lower ends 22 engage the edge portions of the opening 27. The sidewalls will then be cammed inwardly as described above until the notches 20 are aligned with the mother board and the sidewalls will then snap back to their original positions thus locking the guide to the mother board. This mode of assembling permits a high degree of automation in the manufacture of electronic assemblies in that it is a relatively simple operation to insert a member into a panel and is, in fact, commonly done for contact terminals.

Referring now to FIGS. 8 and 9, printed circuit board supports 56 in accordance with the invention can also be of channel-shaped cross-section having a web 58 and sidewalls 60, 62. Again, these sidewalls are provided with crown portions 64 which define laterally extending inwardly and outwardly extending flanges 66, 68. The outwardly extending flanges 68 are notched at the lower end of the guide as shown at 74 and the leading lower end of the connector may again be bevelled if desired. An integral rib 70 extends axially along the web on its outside surface and functions to strengthen the guide and to assist in mounting it in the panel. This rib is also notched as shown at 73.

The support 56 is mounted in the panel opening by engaging the notch 73 with the edge panel opening while the support is inclined with respect to the plane of the board. The support is then swung to a vertical position and the sidewalls are flexed inwardly until the notches 74 engage the board. The panel opening 72 is, in this embodiment, a square hole rather than a rectangular hole.

When the support 56 is used between two aligned connectors 32*a'*, 32*b'* to perform a keying function as well as a supporting function, it is necessary to provide a pair of notches 76 between the edges of the board so that the portion 78 of the board will enter the support between the opposed surfaces of the sidewalls 60, 62. Advantageously, the support is dimensioned such that the portion 78 of the board will substantially fill the space between the sidewalls 60, 62 of the support to provide maximum support for the board upon insertion.

As also shown in FIG. 9, supports of the type shown at 56 may be mounted at the opposite ends of a connector to provide edge support for the printed circuit board without necessarily performing a keying function. Under these circumstances, the supports are positioned in the boards with their open sides facing the ends of the connector so that they are adapted to receive the edges of the boards. It will be apparent that guides of the type shown at 56 must be properly orientated with respect to the openings into which they are inserted, the required orientation depending upon the precise function they are intended to perform.

FIG. 10 shows a further embodiment comprising a card guide 80 which is again of H-shaped cross-section but which may be manufactured by molding process. Card guide 80 has a central web 82 and sidewalls 84, 86, 88, 90 which are spaced-apart by a distance substantially equal to the thickness of the printed circuit board. Laterally extending stops 92, 94 extend outwardly from the outwardly facing surfaces of the sidewalls and define downwardly facing shoulders 95 which are adapted to bear against the upper surface of the mother board. The web portion is again cut away adjacent to the lower end of the guide and suitable shoulders 98 are provided which define upwardly facing surfaces 102 opposed to the surfaces 95. The lower portions of the sidewalls are cut away as shown at 99 to provide downwardly facing support surfaces which are co-planar with the shoulders 95. Again, the support is inserted into a panel by flexing the lower portions of the guide towards each other until the surfaces 102 are lodged beneath the underside of the panel and the surfaces 95, 99 bear against the upper surface of the panel.

It will be apparent that a connector of the type shown in FIG. 10 can be used to provide either edge support for a printed circuit board or can be used between the edges of the board to provide both support and keying as explained with reference to the embodiment of FIG. 1.

Changes in construction will occur to those skilled in the art and various apparently different modifications and embodiments may be made without departing from the scope of the invention. The matter set forth in the foregoing description and accompanying drawings is offered by way of illustration only.

What is claimed is:

1. Supporting and keying means for a printed circuit board or the like, said printed circuit board being mounted on a panel member, said supporting and keying means comprising:

a printed circuit board support having an H-shaped cross section, said support being mounted on said panel member and extending therefrom, said printed circuit board having a notch extending inwardly from one edge thereof, said board being mounted on said panel in straddling relationship to said support with the web portion of said support extending into said notch, electrical contacts on said panel on at least one side of said support, said contacts defining a line extending transversely through said support, said support and said notch means being uniquely located, relative to other supports and printed circuit boards on said panel, whereby said printed circuit board is uniquely keyed to said support.

2. An extrudible support for a printed circuit board or the like comprising:

a pair of co-extensive sidewalls, said sidewalls being joined to each other along one of their longitudinal edges, the other edges of said sidewalls being free edges, said sidewalls being resiliently flexible towards each other, said free edges having laterally outwardly extending flanges thereon, said flanges being notched adjacent to one end of said support, said flanges lying within the cross sectional dimensional limits of said sidewalls when said sidewalls are flexed towards each other whereby, upon flexure of said sidewalls towards each other, said one end of said support can be inserted through a panel opening having substantially the same cross-sectional outline as said sidewalls and upon return of said sidewalls to their normal positions, edge portions of said panel will enter said notches whereby said support will be mounted on said panel.

3. A support as set forth in claim 2, said support having a second pair of sidewalls whereby said support has an H-shaped cross-section.

4. A support as set forth in claim 2 wherein said support has a channel-shaped cross-section, said web having an axially extending rib on its external surface.

5. A support as set forth in claim 2, said support having a second pair of sidewalls whereby said support has an H-shaped cross-section, said sidewalls each having an inwardly extending flange, the opposed edges of said inwardly directed flanges being adapted to engage edge portions of a printed circuit board.

6. A support as set forth in claim 5 wherein said outwardly directed flanges on each sidewall slope towards a plane defined by said web and said inwardly directed flanges slope towards a plane extending normally of said web.

References Cited

UNITED STATES PATENTS

| | | | |
|---|---|---|---|
| 2,935,725 | 5/1960 | Fox. | |
| 3,149,894 | 9/1964 | Fox. | |
| 3,264,525 | 8/1966 | Swengel et al. | 317—101 |
| 3,265,935 | 8/1966 | Rosa. | |
| 3,287,517 | 11/1966 | Campbell | 200—50 |
| 3,333,156 | 7/1967 | Weisman | 317—101 |

FOREIGN PATENTS

| | | |
|---|---|---|
| 1,432,020 | 2/1966 | France. |

MARVIN A. CHAMPION, Primary Examiner

J. H. McGLYNN, Assistant Examiner

U.S. Cl. X.R.

317—101; 339—128, 176, 184